United States Patent
Mouli et al.

(10) Patent No.: US 7,898,010 B2
(45) Date of Patent: Mar. 1, 2011

(54) TRANSPARENT CONDUCTOR BASED PINNED PHOTODIODE

(75) Inventors: Chandra Mouli, Boise, ID (US); Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 690 days.

(21) Appl. No.: 10/880,646

(22) Filed: Jul. 1, 2004

(65) Prior Publication Data

US 2006/0001059 A1  Jan. 5, 2006

(51) Int. Cl.
*H01L 31/113* (2006.01)

(52) U.S. Cl. .............. 257/292; 257/290; 257/291; 257/293; 257/458; 257/461; 257/462; 257/463; 257/464; 257/E21.54; 257/E27.14

(58) Field of Classification Search ......... 257/290–293, 257/458, 461–464
See application file for complete search history.

(56) References Cited

U.S. PATENT DOCUMENTS

| | | | |
|---|---|---|---|
| 6,101,232 A | 8/2000 | Fossum et al. | |
| 6,232,626 B1 | 5/2001 | Rhodes | |
| 6,414,342 B1 | 7/2002 | Rhodes | |
| 6,500,692 B1 | 12/2002 | Rhodes | |
| 6,611,037 B1 | 8/2003 | Rhodes | |
| 2001/0032979 A1 | 10/2001 | Rhodes | |
| 2002/0000562 A1 | 1/2002 | Carlson et al. | |
| 2002/0089004 A1 | 7/2002 | Rhodes | |
| 2002/0109157 A1 | 8/2002 | Rhodes | |
| 2002/0109164 A1 | 8/2002 | Rhodes | |
| 2002/0185654 A1 | 12/2002 | Carlson | |
| 2003/0089929 A1 | 5/2003 | Rhodes | |
| 2003/0205741 A1 | 11/2003 | Rhodes | |
| 2004/0178323 A1 | 9/2004 | Rhodes | |
| 2004/0188727 A1 | 9/2004 | Patrick | |
| 2004/0195600 A1 | 10/2004 | Rhodes | |

OTHER PUBLICATIONS

D.L. Losee, et al., "All-ITO Gate, Two-Phase CCD Image Sensor Technology," IEDM p. 03-397.

*Primary Examiner*—Lynne A Gurley
*Assistant Examiner*—Samuel A Gebremariam
(74) *Attorney, Agent, or Firm*—Dickstein Shapiro LLP

(57) ABSTRACT

A pinned photodiode with improved short wavelength light response. In exemplary embodiments of the invention, a gate oxide is formed over a doped, buried region in a semiconductor substrate. A conductor is formed on top of the gate oxide. The gate conductor is transparent, and in one embodiment is a layer of indium-tin oxide. The transparent conductor can be biased to reduce the need for a surface dopant in creating a pinned photodiode region. The biasing of the transparent conductor produces a hole-rich accumulation region near the surface of the substrate. The gate conductor material permits a greater amount of charges from short wavelength light to be captured in the photo-sensing region in the substrate, and thereby increases the quantum efficiency of the photosensor.

30 Claims, 14 Drawing Sheets

US 7,898,010 B2

TRANSPARENT CONDUCTOR BASED PINNED PHOTODIODE

FIELD OF THE INVENTION

The present invention relates generally to CMOS imagers and in particular to a CMOS imager having improved responsiveness to short wavelengths of light.

BACKGROUND OF THE INVENTION

CMOS imagers are increasingly being used as low cost imaging devices. A CMOS imager circuit includes a focal plane array of pixel cells, each one of the cells including a photosensor, for example, a photogate, photoconductor or a photodiode overlying a substrate for accumulating photo-generated charge in the underlying portion of the substrate. A readout circuit is connected to each pixel cell and includes at least pixel selecting field effect transistor formed in the substrate and a charge storage region formed on the substrate connected to the gate of a transistor coupled to the pixel selecting transistor. The charge storage region may be constructed as a floating diffusion region. The imager may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the necessary functions of: (1) photon to charge conversion; (2) accumulation of image charge; (3) resetting the storage region to a known state before the transfer of charge to it; (4) transfer of charge to the storage region accompanied by charge amplification; (5) selection of a pixel for readout; and (6) output and amplification of a signal representing a reset voltage and a signal representing pixel charge. Photo charge may be amplified when it moves from the initial charge accumulation region to the storage region. The charge at the storage region is typically converted to a pixel output voltage by a source follower output transistor.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes, all assigned to Micron Technology, Inc. The disclosures of each of the foregoing are hereby incorporated by reference herein in their entirety.

To provide context for the invention, an exemplary CMOS APS (active pixel sensor) cell 10 is described below with reference to FIGS. 1 and 2. FIG. 1 is a top-down view of pixel cell 10; and FIG. 2 is a cross-sectional view of the cell 10, take along line A-A' of FIG. 1. The cell 10 is a four transistor (4T) pixel sensor cell. The illustrated cell 10 shown includes a photodiode 13 formed as a pinned photodiode as shown in FIG. 2. Alternatively, the CMOS APS cell 10 may include a photogate, photoconductor or other photon to charge converting device, in lieu of a pinned photodiode 13, as the initial accumulating area for photo-generated charge. The photodiode 13 includes a p+ surface accumulation layer 5 and an underlying n− accumulation region 14 in a p-type semiconductor substrate layer 1.

The cell 10 of FIG. 1 has a transfer gate 7 for transferring photocharges generated in the n− accumulation region 14 to a floating diffusion region 3 (storage node). The floating diffusion region 3 is further connected to a gate 27 of a source follower transistor. The source follower transistor provides an output signal to a row select access transistor having gate 37 for selectively gating the output signal to a pixel array column line, shown as the out line in FIG. 1. A reset transistor having gate 17 resets the floating diffusion region 3 to a specified charge level before each charge transfer from the n− region 14 of the photodiode 13.

Referring to FIG. 2, the pinned photodiode 13 is formed on a p-type substrate base 1; alternatively, the photodiode 13 can be formed in a p-type epitaxial layer (not shown) grown on a substrate base. It is also possible, for example, to have a p-type substrate base beneath p-wells in an n-type epitaxial layer. The n− accumulation region 14 and p+ accumulation region 5 of the photodiode 13 are spaced between an isolation region 9 and a charge transfer transistor gate 7. The illustrated, pinned photodiode 13 has a p+/n−/p− structure.

The photodiode 13 has two p-type regions 5, 1 having a same potential so that the n− accumulation region 14 is fully depleted at a pinning voltage ($V_{pin}$). The photodiode 13 is termed "pinned" because the potential in the photodiode is pinned to a constant value, $V_{pin}$) when the photodiode 13 is fully depleted. When the transfer gate 7 is conductive, photo-generated charge is transferred from the charge accumulating n− region 14 to the floating diffusion region 3. A complete transfer of charge takes place when a voltage on the floating diffusion region 3 remains above $V_{pin}$ while the pinned photodiode functions at a voltage below $V_{pin}$. An incomplete transfer of charge results in image lag.

The isolation region 9 is typically formed using a conventional shallow trench isolation (STI) process or by using a Local Oxidation of Silicon (LOCOS) process. The floating diffusion region 3 adjacent to the transfer gate 7 is commonly n− type. Translucent or transparent insulating layers, color filters, and lens structures are also formed over the cell 10.

Additionally, impurity doped source/drain regions 32 (FIG. 1), having n-type conductivity, are provided on either side of the transistor gates 17, 27, 37. Conventional processing methods are used to form contacts (not shown) in an insulating layer to provide an electrical connection to the source/drain regions 32, the floating diffusion region 3, and other wiring to connect to gates and form other connections in the cell 10.

Generally, in CMOS pixel cells, such as the cell 10 of FIGS. 1 and 2, incident light causes electrons to collect in the accumulation n− region 14. An output signal produced by the source follower transistor having gate 27 is proportional to the number of electrons extracted from the n− accumulation region 14. The maximum output signal increases with increased electron capacitance or acceptability of the n− region 14 to acquire electrons. In this example, the p+/n− junction dominates the capacitance of the pinned photodiode 13.

In a pixel imager cell having a pinned photodiode as just described, blue light, and other short wavelength light, are typically absorbed at the top of the junction of the p+/n− regions while red light is absorbed at the bottom of the n-type accumulation region. For example, at room temperature, red light ($\lambda$=approximately 700 nm) will penetrate approximately 3.0 microns deep into polysilicon, while violet light ($\lambda$=approximately 400 nm) will only penetrate approximately 0.2 microns deep. It becomes very critical, therefore, to create a very shallow p/n junction near the top of the pixel cell surface in order to improve the quantum efficiency of the cell when exposed to shorter wavelengths of light. Moreover, the surface p-type layer should be of significantly high concentration so that it does not get depleted at bias conditions when the bottom n-type layer gets fully depleted.

It is difficult using the conventional methods of implant engineering to create a pinned photodiode having these desired characteristics. Either the process requires significant and challenging mask levels and implant conditions (which can be costly) or potential barriers and wells may develop in the photo-sensing area, decreasing the quantum efficiency of the cell. Furthermore, as the size of pixel cells continues to decrease due to desired scaling, implant optimization becomes increasingly more difficult.

There is needed, therefore, a pixel cell having a pinned photodiode with a shallow junction having minimal potential barriers. Also needed is a simple method of fabricating a pixel cell having these desired characteristics.

SUMMARY OF THE INVENTION

The invention provides a pinned photodiode with improved short wavelength light response. In exemplary embodiments of the invention, a gate oxide is formed over a doped, buried region in a semiconductor substrate. A gate conductor is formed on top of the gate oxide. The gate conductor is transparent, and in one embodiment is a layer of indium-tin oxide. The transparent conductor can be biased to reduce the need for a surface dopant in creating a pinned photodiode region. The biasing of the transparent conductor produces a hole-rich accumulation region near the surface of the substrate. The gate conductor material permits a greater amount of charges from short wavelength light to be captured in the photo-sensing region in the substrate, and thereby increases the quantum efficiency of the photosensor.

In accordance with one exemplary embodiment of the invention, the transparent conductor over the photodiode extends over the transfer gate and other devices in the array. Since indium tin oxide is a conductor, it can be utilized as part of the gate electrode for gatestacks in the array.

Additional advantages and features of the present invention will be apparent from the following detailed description and drawings which illustrate preferred embodiments of the invention.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative pixel is illustrated in the figures, and description herein, and typically fabrication of all pixels in an imager array will proceed simultaneously in a similar fashion. The term "short wavelength light" is used as a generic term to refer to electromagnetic radiation having a wavelength within the range of approximately 385 to 550 nm, which includes green-blue, blue, indigo, and violet light. The following detailed description is, therefore, not to be taken in a limiting sense, and the scope of the present invention is defined by the appended claims.

Figure 3:
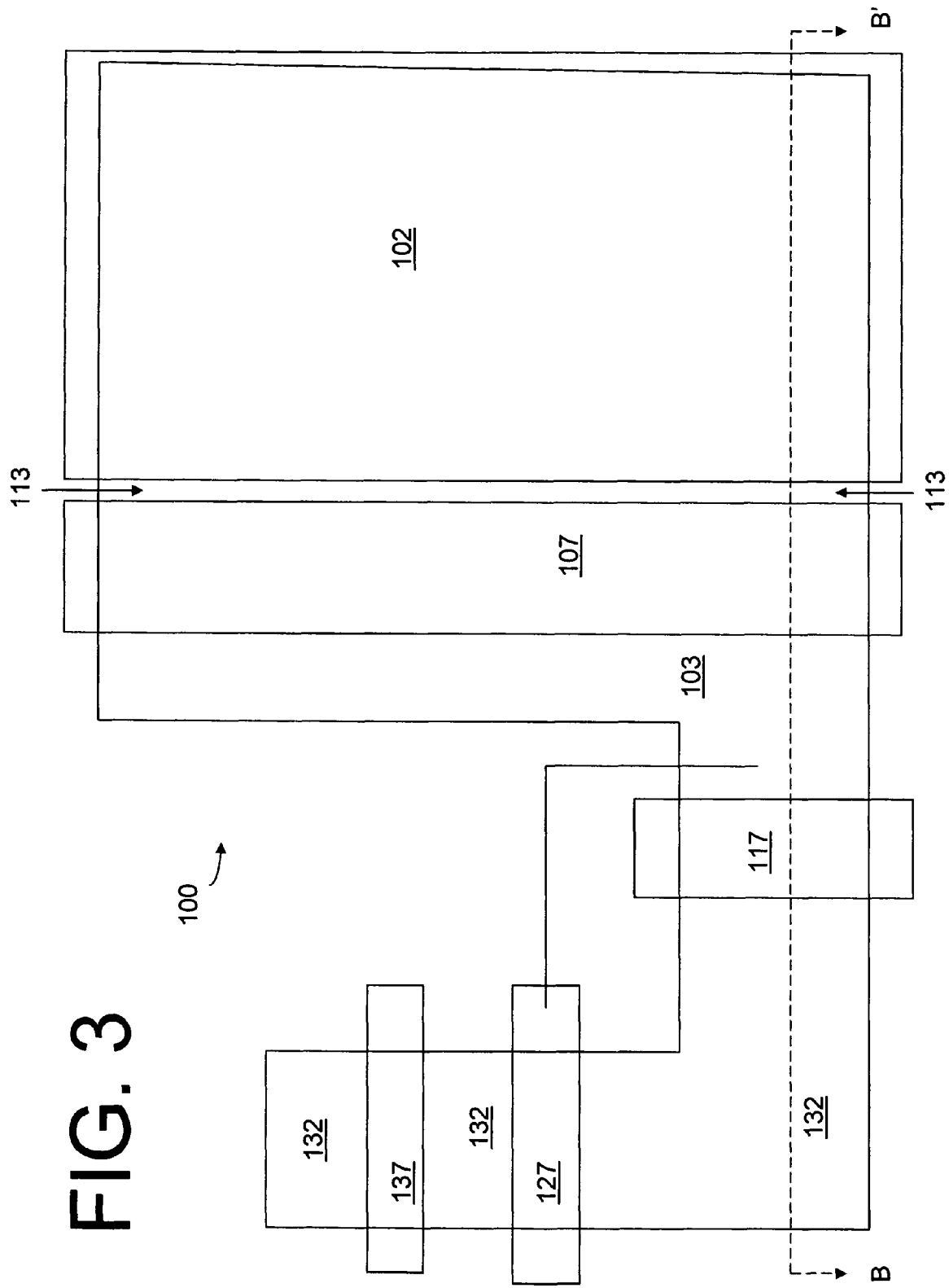
FIG. 3 is a top plan view of an exemplary CMOS pixel cell according to an embodiment of the present invention.
Figure 4:
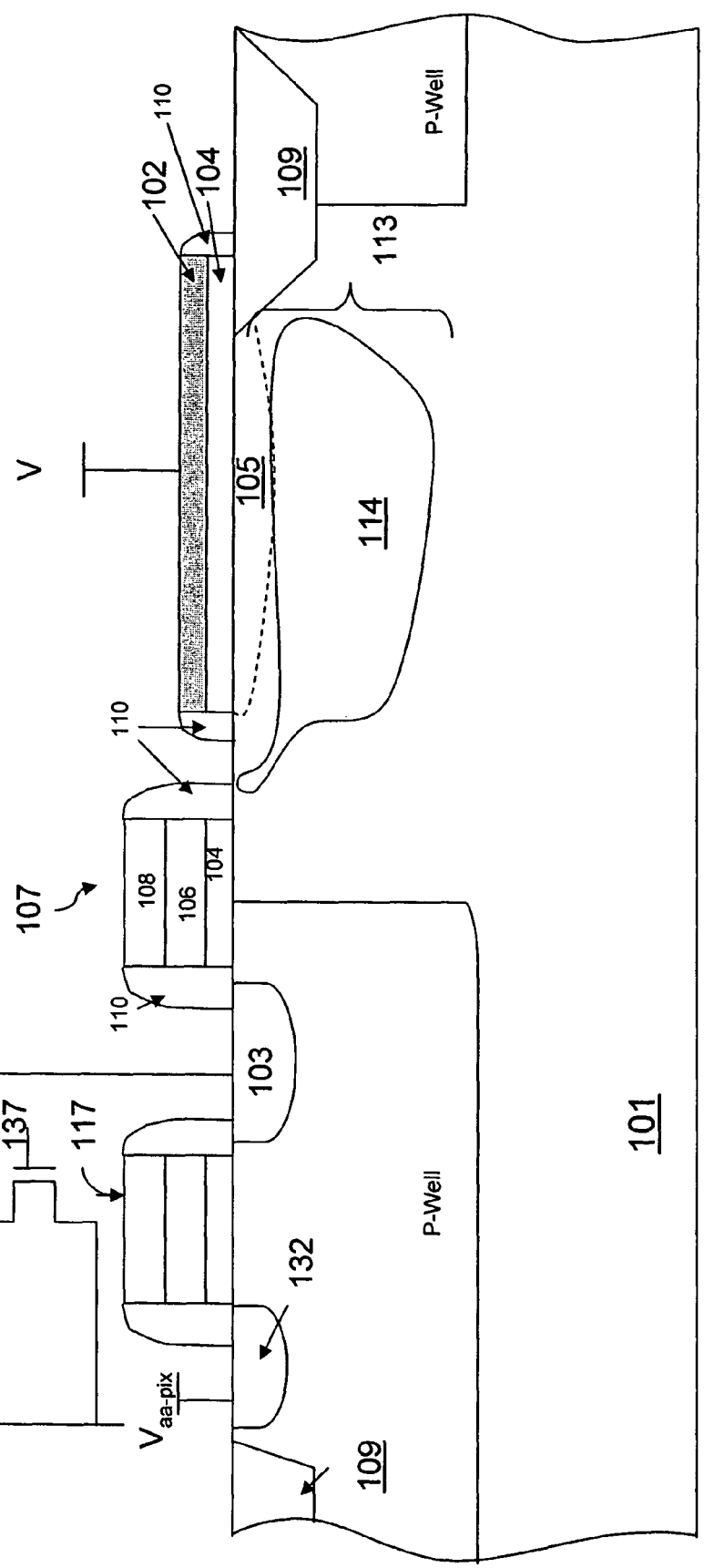
FIG. 4 is a cross-sectional view of part of the exemplary CMOS pixel cell of FIG. 3, taken along line B-B'.

Turning now to the drawings, where like elements are designated by like reference numerals, FIGS. 3 and 4 illustrate an exemplary pixel cell 100, in accordance with an exemplary embodiment of the present invention, having increased quantum efficiency for short wavelength light. FIG. 3 illustrates a top-down view of the pixel cell 100, and FIG. 4 is a cross-sectional view of part of the pixel cell 100 of FIG. 3, taken along line B-B'.

The exemplary pixel cell 100 has a pinned photodiode region 113 for sensing light. For exemplary purposes, this photodiode 113 is formed of a p-type substrate 101 with a buried n-type accumulation region 114 and p-wells as shown.

Preferably, the substrate 101 is lightly doped p−, having an active dopant concentration within the range of approximately $3 \times 10^{14}$ to approximately $1 \times 10^{16}$ atoms per cm$^3$. When exposed to light, the photodiode 113 converts photons to charge, and the n-type doped region (accumulation region) 114 accumulates the charge. The charge is then transferred through the transfer transistor 107, when the transistor is turned on, to the floating diffusion region 103. The charge is then stored in the floating diffusion region 103 until it is read out. The floating diffusion region 103 is electrically connected to the gate of source follower transistor 127 for this readout. A reset transistor 117 is also connected to the floating diffusion region 103, and is used to reset the charge of the diffusion region 103. In this exemplary embodiment, the floating diffusion region 103 is lightly doped n-type.

The pixel cell 100 also has a row select transistor 137 which connects the pixel cell 100 to an associated column line 125 of a pixel array. Additionally, source/drain regions 132, and a shallow trench isolation region 109 are formed in the substrate 101. It should be understood that the isolation region 109 can be formed using conventional isolation techniques, including, but not limited to etching a shallow trench and filling the trench with a dielectric material, such as an oxide, oxynitride, or other suitable material to form an STI isolation region.

Figure 4A:
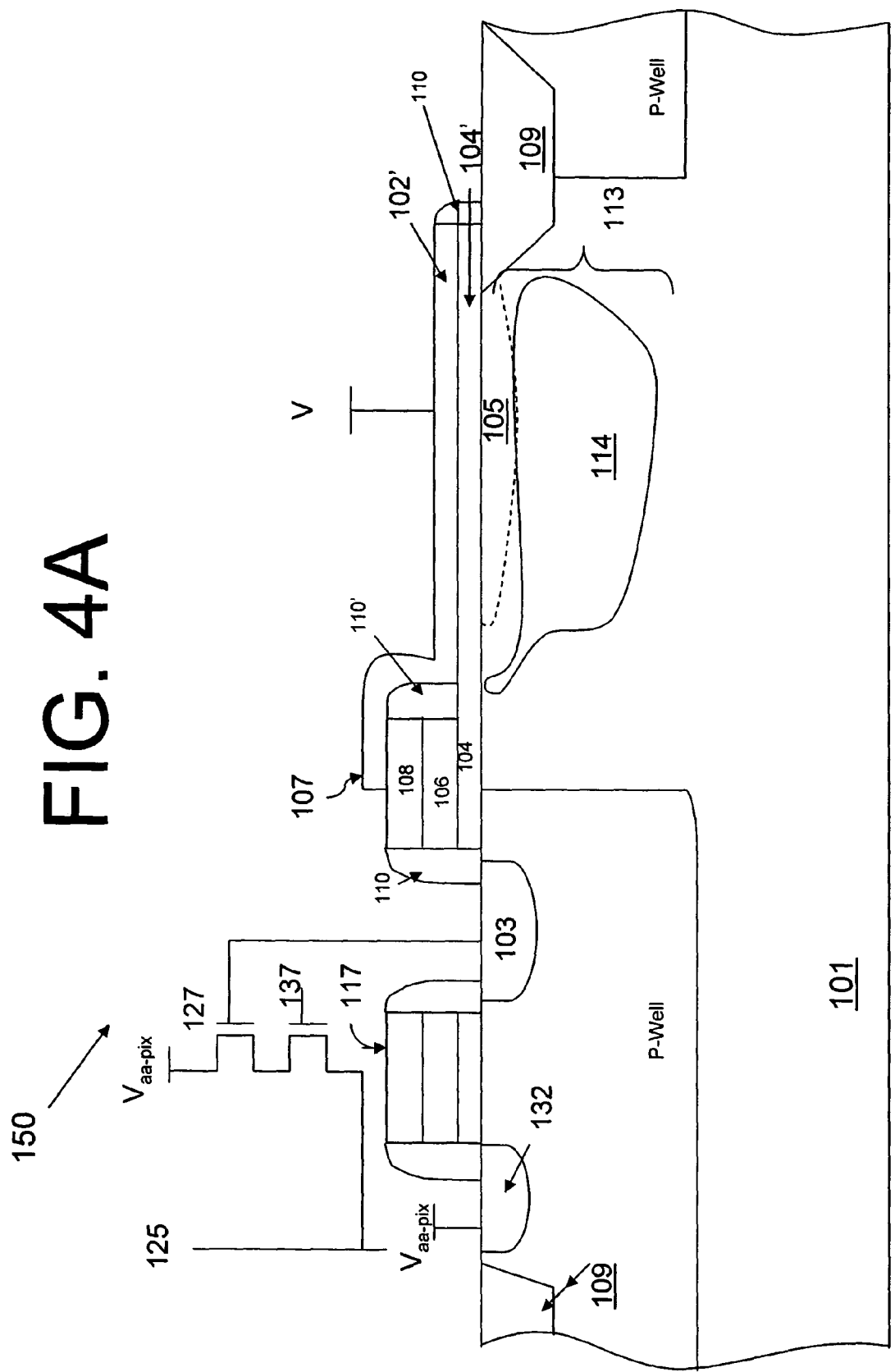
FIG. 4A is a cross-sectional view of part of an exemplary CMOS pixel cell in accordance with a second exemplary embodiment.

The exemplary pixel cell 100 also includes a transparent conductive layer 102, located above the surface of the substrate 101, over the photodiode 113. The transparent conductive layer 102 preferably covers the majority of the photodiode 113 area and may also cover at least part of the isolation region 109, as shown in FIG. 4. The transparent conductor 102 may also extend over the transfer gate 107 as shown in FIG. 4A. The conductive layer 102 is separated from the surface of the substrate 101 by an oxide, or other insulating layer 104. In a preferred embodiment, the insulating layer 104 comprises silicon dioxide. Also shown in FIG. 4, the transparent conductive layer 102 is adapted for connection to a voltage source.

A second exemplary embodiment of the present invention is illustrated in FIG. 4A, which depicts a pixel cell 150, similar to pixel cell 100, except for the formation of the insulating layer 104 and transparent conductive layer 102. Pixel cell 150 has an insulating layer 104' which goes under not only the transparent conductive layer 102', but also serves as the insulating layer of the gatestack of the transfer transistor 107. In this second embodiment, the gatestack for the transfer transistor is fabricated including sidewall 110'; subsequently, the transparent conductive layer 102' is formed to extend over part of the transfer transistor 107 as illustrated. The operation and formation of pixel cell 150 is in other ways equivalent to that of pixel cell 100, as now described.

Figure 1:
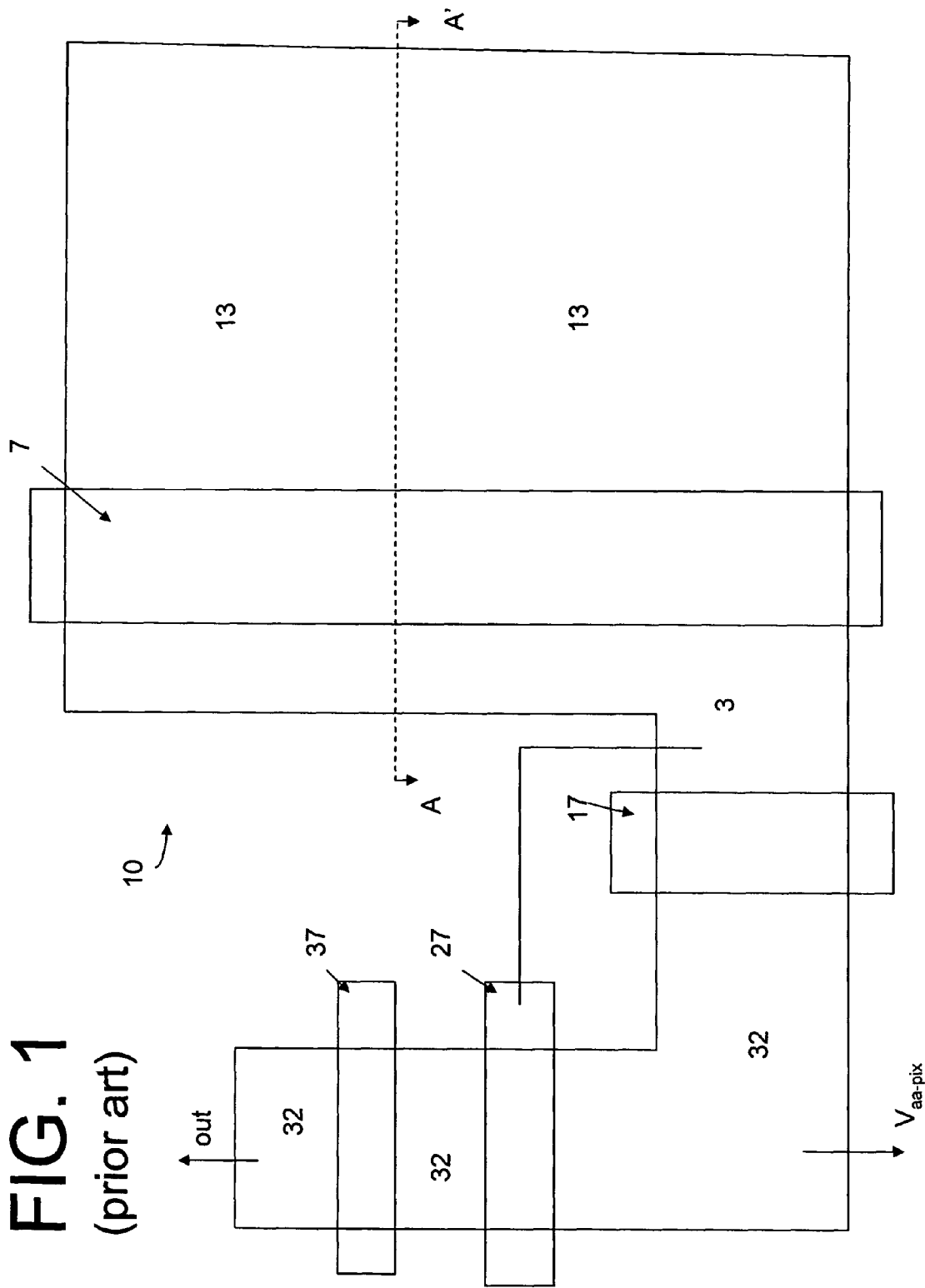
FIG. 1 is a top plan view of a related CMOS pixel cell.
Figure 2:
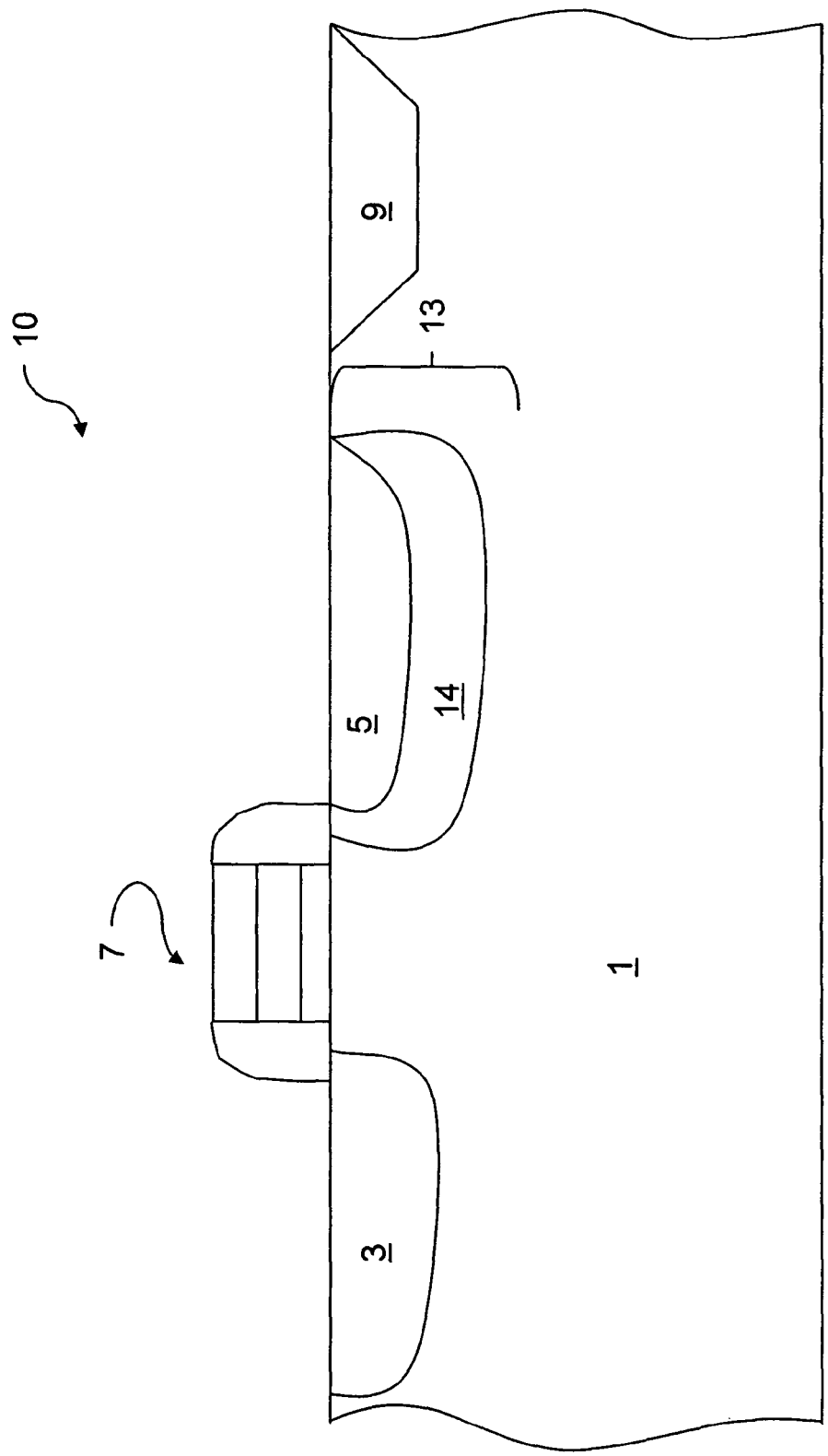
FIG. 2 is a cross-sectional view of a related CMOS pixel cell of FIG. 1, taken along line A-A'.

In operation of the pixel cell 100, the conductive layer 102 can be biased by applying a voltage potential. Depending on the type of materials used during fabrication, the applied potential may be slightly negative or slightly positive. It is also possible for the conductive layer 102 to be left floating (depending on the materials used for fabrication). For example, given a p-type substrate 101 with a buried n-type accumulation region 114, a hole accumulation region 105 is desired so that additional dopants are not required to produce a p/n junction near the surface of the substrate 101. Thus a slightly negative potential may be applied to the transparent conductive layer 102, preferably in the range of about 0 to about −0.5V. This biasing of conductive layer 102 causes the formation of a second accumulation region 105, shown in FIG. 4, acting effectively as a p+ type region. The pixel cell 100 therefore can have a very shallow depletion region in the order of tens of Angstroms from the surface. A conventional pixel cell 10 (FIG. 2), that utilizes conventional implants to form a p-type surface region 5, has a depletion region in the order of hundreds of Angstroms from the surface of the substrate. Thus, by using a biased, transparent conductive layer 102 in accordance with the present invention, a shallow p/n junction is created. In effect, when incident photons are absorbed in the substrate 101, electron/hole pairs are created; the lower accumulation region 114 accumulates the electrons, and the second accumulation region 105 accumulates the holes. Additionally, utilizing exemplary conductive layer 102, which is transparent to lower wavelengths of light, rather than a traditional gate conductor material, increases the quantum efficiency of the pixel cell 100.

Figure 12:
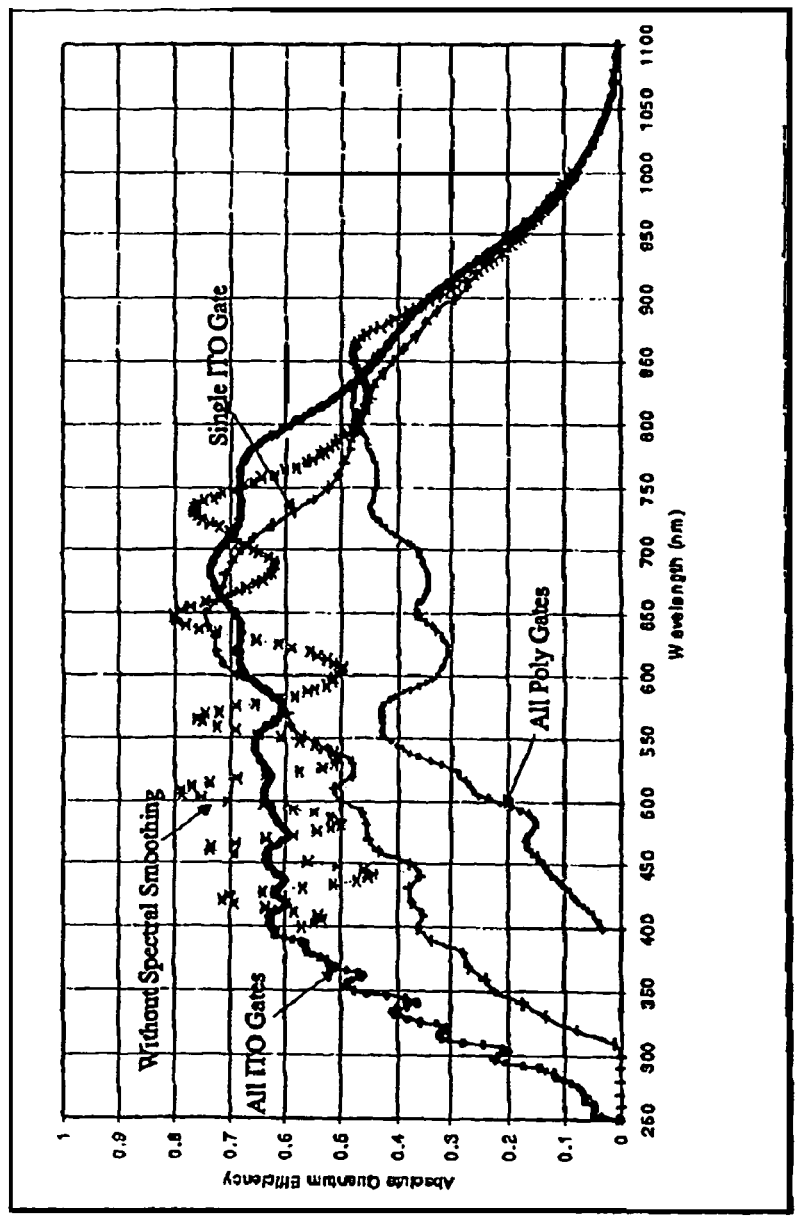
FIG. 12 is a graph of measured quantum efficiencies as a function of wavelength for CCD cells using poly gates and using ITO gates.

In a preferred embodiment of the present invention, the transparent conductive layer 102 is indium-tin oxide (In$_x$Sn$_y$O$_z$). As illustrated by the graph of FIG. 12, indium-tin oxide has been known to increase the quantum efficiency of CCD image sensors over traditional gate materials. As explained in "An All-ITO Gate, Two-Phase CCD Image Sensor Technology," D. L. Losee, et al., *IEDM*, at 397 (2003), polysilicon conductive layers are nearly opaque at lower wavelengths, and therefore, polysilicon materials over the sensing region decreases the efficiency of the CCD cell. Especially within the range of 400 to 700 nm, the use of indium-tin oxide as a conductive layer significantly increases the quantum efficiency of the cell. Other transparent conductive materials, such as tin oxide (SnO$_2$) and indium oxide (In$_2$O$_3$), among others, can be used to form the transparent conductive layer by tailoring the work function of these materials. For example, a thin doped polysilicon layer having a thickness of less than about 1500 Angstroms is transparent to photons in the visible spectrum and could be used as the transparent conductive layer 102.

FIGS. 5-9 illustrate an exemplary method of fabricating the exemplary pixel cell 100. For the sake of simplicity, only part of the exemplary pixel cell 100 of FIG. 4 is illustrated. It should be understood that the method is not limited to a specific sequence of step for any of the actions described herein, except for those logically requiring the results of prior actions. Accordingly, while the actions below are described as being performed in a general order, the order is exemplary only and can be altered unless otherwise stated.

Figure 5:
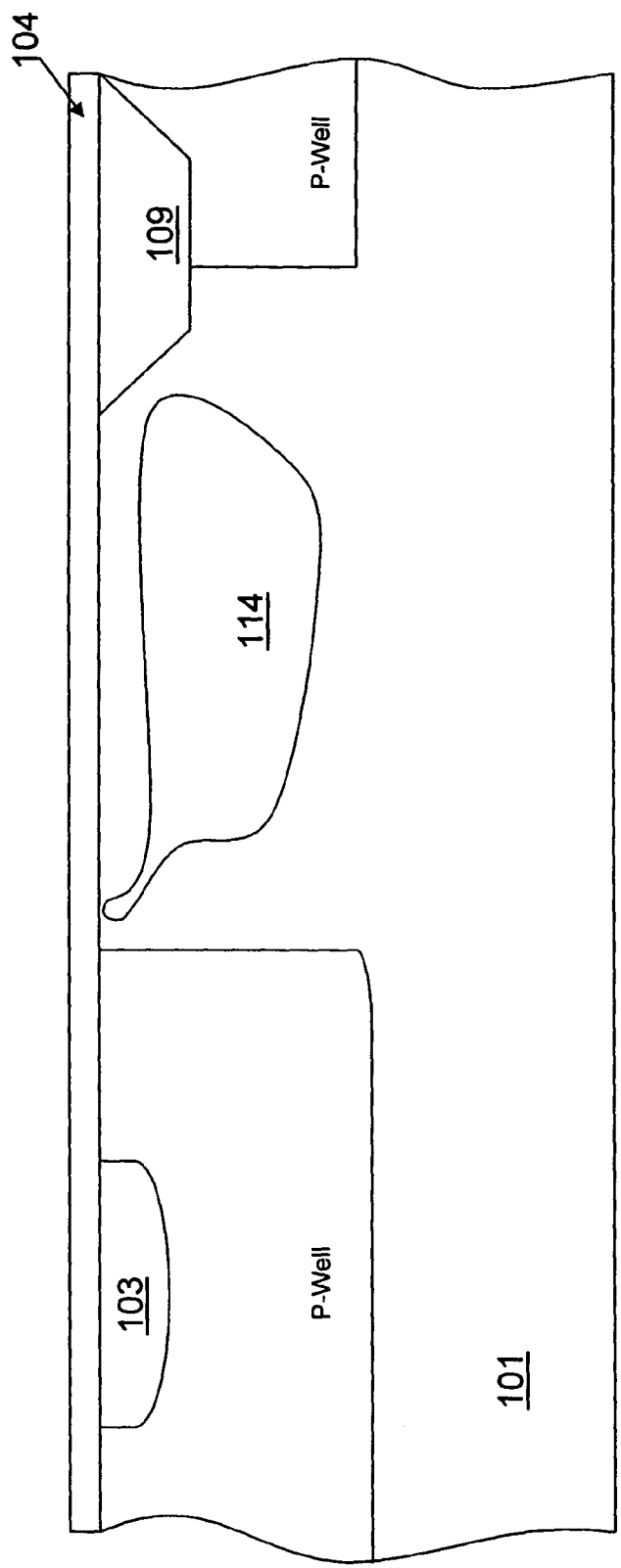
FIG. 5 is a cross-sectional view of part of the exemplary CMOS pixel cell of FIG. 4 at an initial stage of fabrication.

As shown in FIG. 5, an n-type buried accumulation region 114 and an n-type floating diffusion region 103 are formed in a p-type substrate 101. These regions can be formed using any suitable implantation technique. For example, any one of phosphorus, arsenic, and antimony ions may be implanted into the substrate to create n-type regions, and boron ions can be implanted to create p-type doped regions. The preferred active concentration of the buried accumulation region 114 is about $1.0*10^{16}$ to about $1.0*10^{18}$ atoms per cm$^3$. As mentioned above, an isolation region 109 is formed in the substrate. The region 109 may be formed using known STI formation techniques. Next, an insulating layer 104 is deposited over the surface of the substrate 101. The insulating layer 104 may be formed of any suitable dielectric (e.g., silicon dioxide) capable of insulating the conductive layer 102 from the surface of the substrate 101. The insulating layer 104 is deposited to a thickness in the range of about 20 to about 1000 Angstroms, preferably about 30-100 Angstroms thick.

Figure 6:
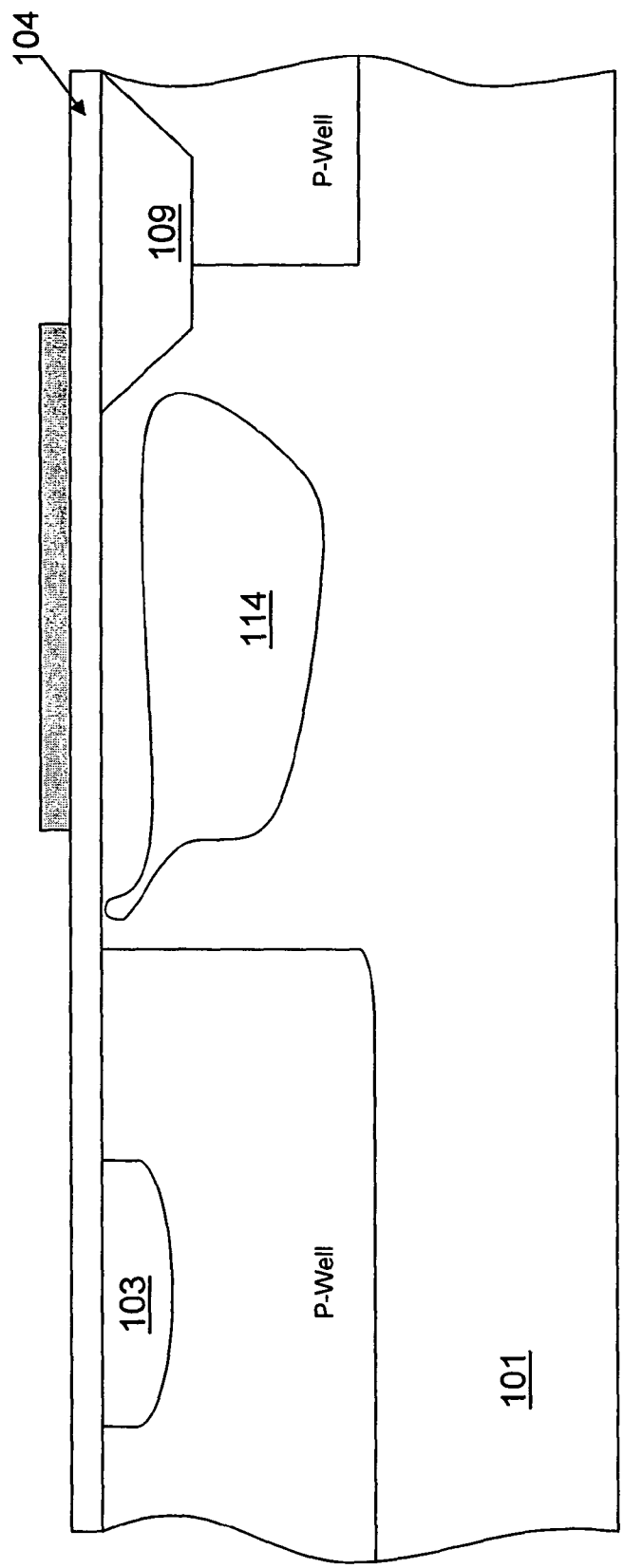
FIG. 6 is a cross-sectional view of part of the exemplary CMOS pixel cell of FIG. 4 at a stage of fabrication subsequent to FIG. 5.

Turning to FIG. 6, the transparent conductive layer 102 is selectively deposited over the insulating layer 104 in the area above the n-type accumulation region 114 and over at least part of the isolation region 109. Using conventional masking techniques, the conductive layer 102 is spaced out from the area where the transfer gate of the transfer transistor 107

(FIG. 4) will be formed. The transparent conductive layer 102 is deposited to a thickness in the range of about 50 to about 3000 Angstroms, and is preferably about 200-1000 Angstroms thick. After deposition, an annealing step is performed to improve the transparency of the conductive layer 102. This annealing step is performed in an oxygen-containing ambient, heated to approximately 200 to approximately 800 degrees Celsius. The ambient can be, for example, gaseous or plasma $O_2$ or gaseous or plasma $O_3$ (ozone).

Figure 7:
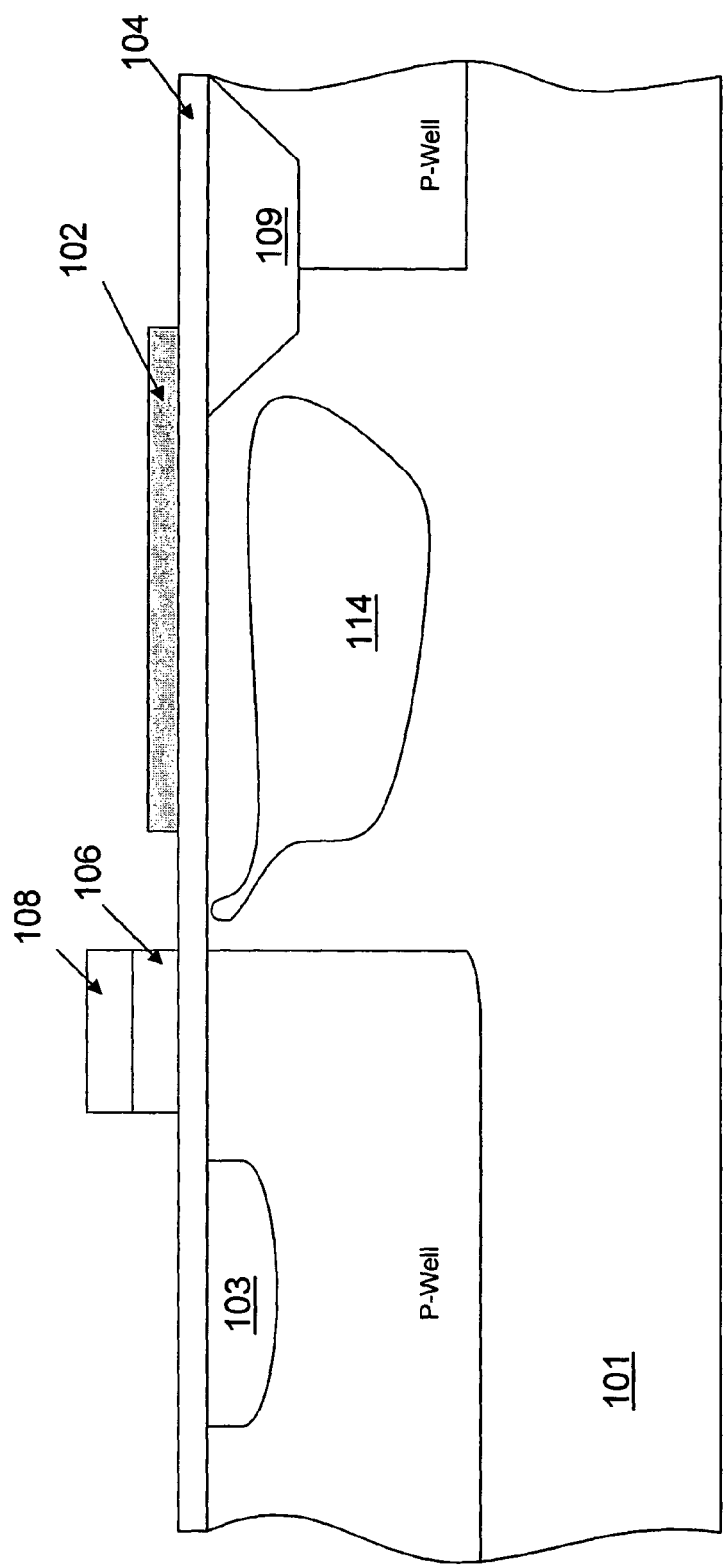
FIG. 7 is a cross-sectional view of part of the exemplary CMOS pixel cell of FIG. 4 at a stage of fabrication subsequent to FIG. 6.

FIG. 7 illustrates the formation of the gatestack for the transfer transistor 107. The gatestack for the transfer transistor includes a dielectric layer 108 formed over a conductive layer 106, formed over the insulating layer 104. The dielectric layer 108 and the conductive layer 106 are selectively formed, using conventional blanket deposition and etching/masking techniques, in the area above and just adjacent the n-type accumulation region 114. The dielectric 108 and conductive layer 106 may be formed of any suitable materials as known in the art, and the invention is in no way limited by the manner of formation of the transfer transistor. It should be understood that other transistors of the pixel cell 100, (such as the reset 117, source follower 127 and row select 137 transistors, as shown in FIG. 3) may be formed at the same time and using the same materials as the transfer transistor 107.

Figure 7A:
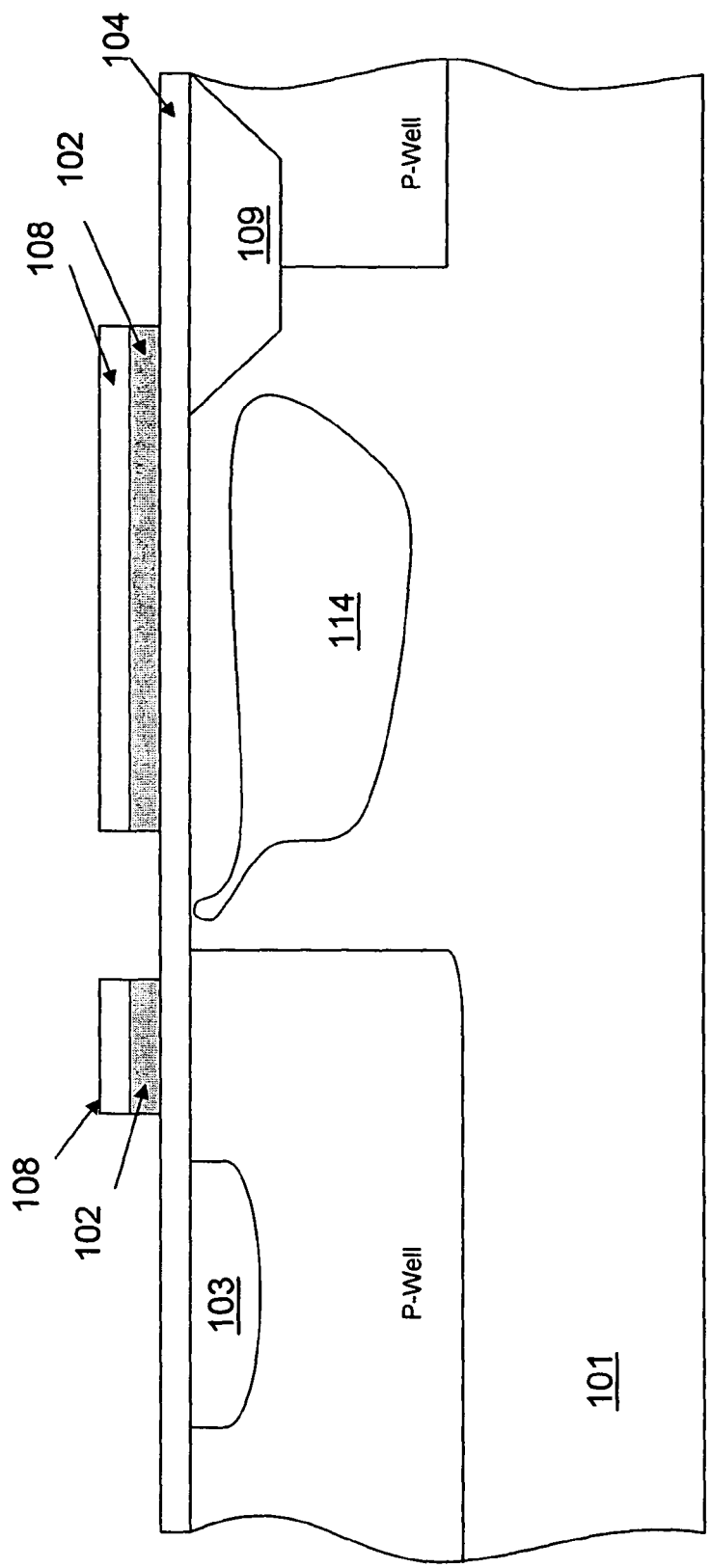
FIG. 7A is a cross sectional view of part of an exemplary CMOS pixel cell at a stage of fabrication subsequent to FIG. 5 according to a third exemplary embodiment.

As illustrated in FIG. 7A, a second exemplary method of forming the pixel cell 100 includes the initial fabrication steps as illustrated in FIG. 5, but differs in the formation of the transistor gatestacks as just described. For some circuits where the speed of the transistors gates is a major concern, the conductive layers need to be a doped polysilicon or some other highly conductive material. If however, speed is not a major concern, the complexity of fabricating the pixel cell 100 can be significantly reduced by using the transparent conductive layer 102 for the conductive layer of each transistor of the cell 100. Thus, the only difference in the second exemplary embodiment as illustrated in FIG. 7A is that the conductive layer 106 (FIG. 7) of the transfer transistor 107 gatestack comprises the same material as the transparent conductive layer 102. Similarly, the transparent conductive layer 102 can form the conductive layer for all of the transistor gatestacks on the pixel cell 100, including the source follower transistor 127 gatestack and the row select transistor 137 gatestack. The transparent conductive layer 102 may be deposited as a thin film over the entire surface of the insulating layer 104, a second insulating layer may then be blanket deposited over the conductive layer 102, and then the structure can be etched as desired to form gatestacks. Also shown in FIG. 7A, the dielectric layer 108, of the transfer transistor 107 gatestack, can also be selectively deposited over the transparent conductive layer 102.

Figure 8:
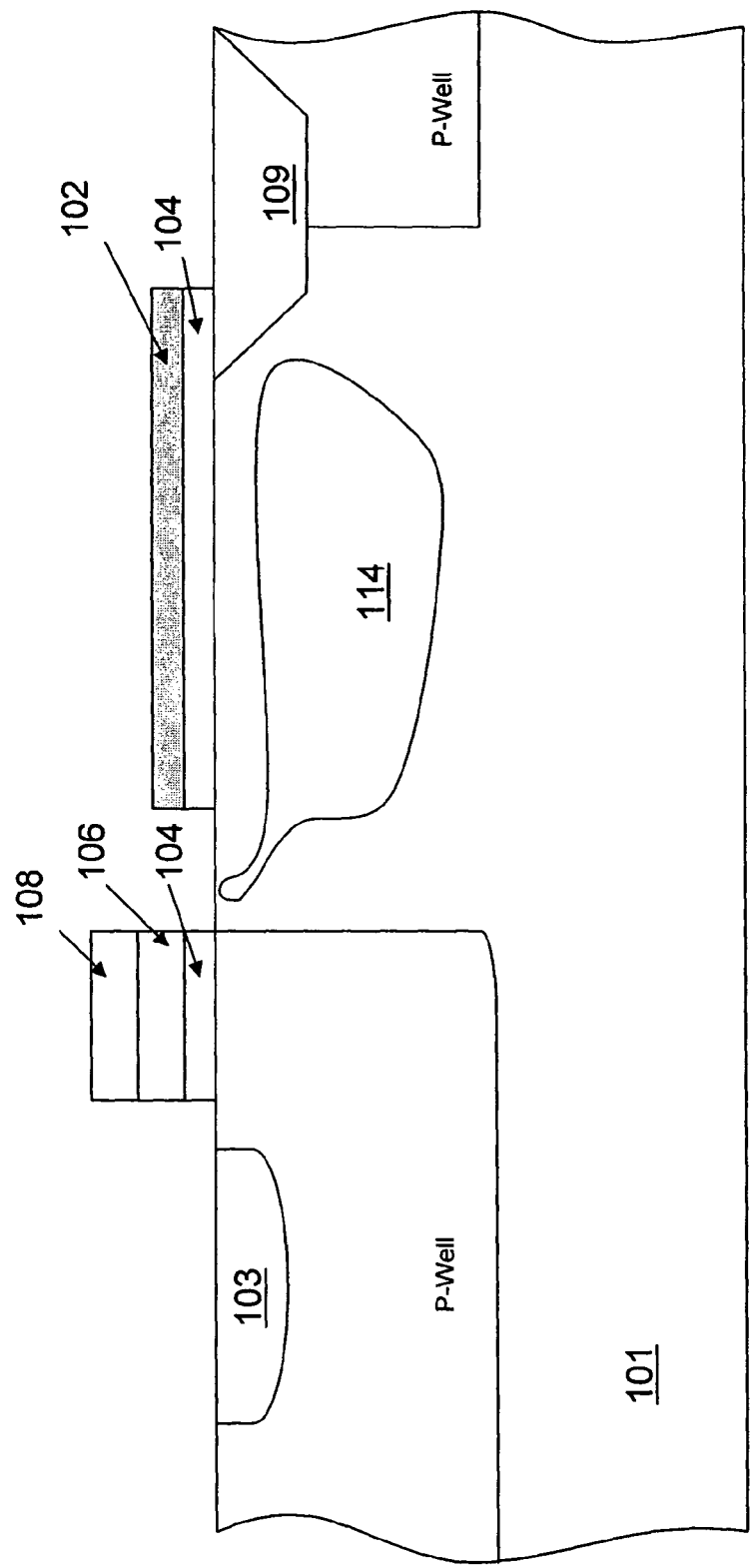
FIG. 8 is a cross-sectional view of part of the exemplary CMOS pixel cell of FIG. 4 at a stage of fabrication subsequent to FIG. 7.
Figure 9:
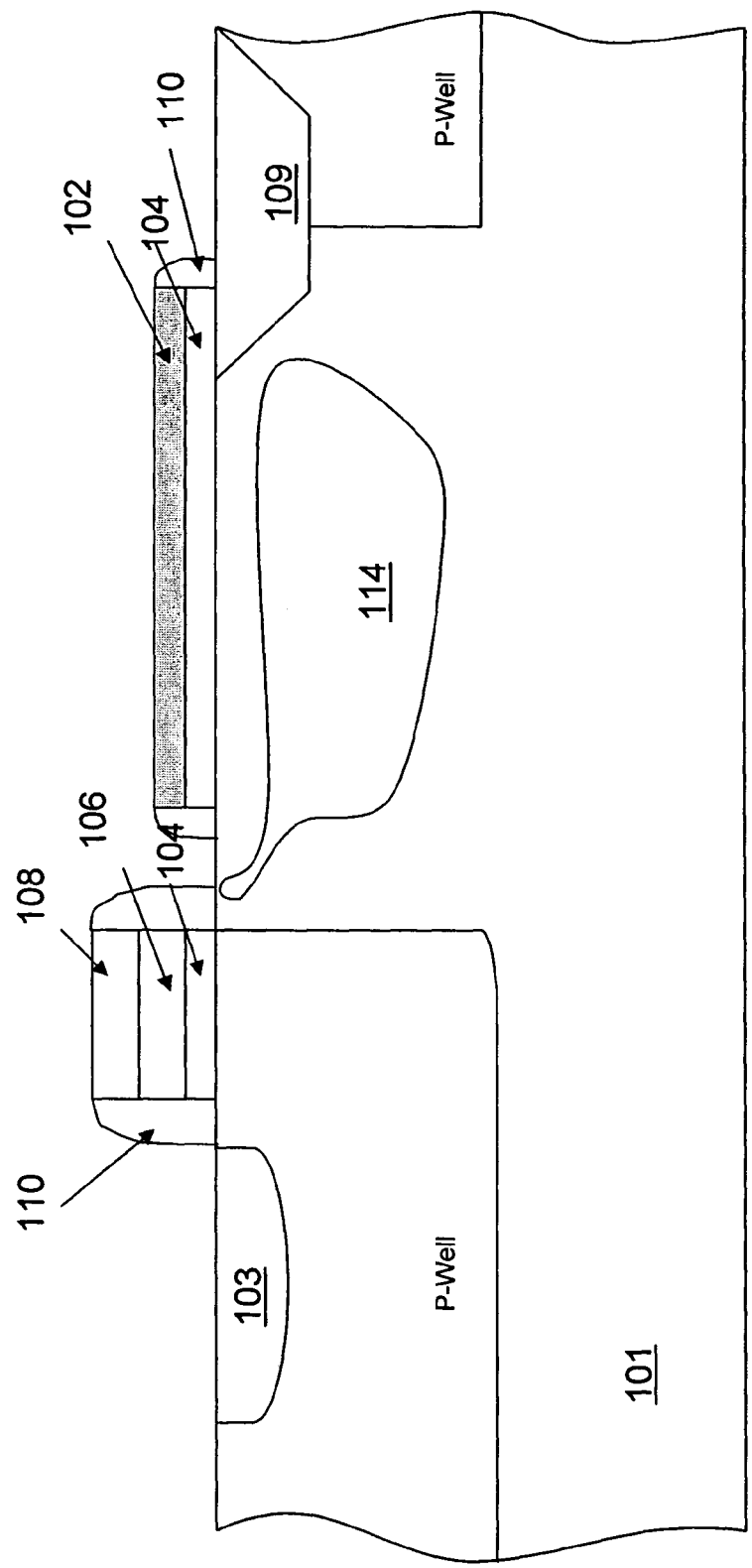
FIG. 9 is a cross-sectional view of part of the exemplary CMOS pixel cell of FIG. 4 at a stage of fabrication subsequent to FIG. 8.

The remainder of the discussion refers back to the first exemplary embodiment, described above with reference to FIGS. 3-7, completing fabrication of the exemplary pixel cell after the steps shown in FIG. 7. However, it should be understood that the following steps apply to the completion of the second exemplary embodiment (FIG. 7A) as well. As shown in FIG. 8, the insulating layer 104 is selectively etched, using any suitable etchant. This etching step leaves the insulating layer 104, as desired, beneath the transparent conductive layer 102 and the conductive layer 106 of the transfer transistor 107. The next fabrication step forms insulating sidewalls 110 on the transistor gatestacks of the cell (FIG. 9) and on the gatestack formed of the transparent conductive layer 102. The insulating sidewalls 110 may be formed of any suitable materials, including, but not limited to a nitride or oxide.

At this stage, the formation of the exemplary pixel sensor cell 100 is essentially complete. Additional processing steps may be used to form insulating, shielding, metallization layers, color filters and lens layers, as known in the art. For example, an inter-level dielectric (ILD) may be formed over and adjacent the transparent conductive layer 102 and transistor gate stacks. The ILD is planarized, and conductors can be formed on and within alternating layers of ILD. In order to maintain the high level of quantum efficiency of the pixel cell 100 of the invention, the upper layer wiring may be routed around the areas above the photosensor or transparent metallization layers may be used, so that light is not blocked for the photosensor. Conventional layers of conductors and insulators (not shown) may also be used to interconnect the structures and to connect the pixel to peripheral circuitry, as described in more detail below. After the metallization and associated insulating layers are fabricated, color filter and lens layers may be added as known in the art.

It should also be understood that the invention is not limited to the four transistor (4T) configuration of the pixel cell 100 as described herein; instead, the invention can be utilized on other pixel cell configurations, including pixel designs having more (e.g., 5T, 6T, etc.) or fewer transistors (e.g., 2T, 3T).

Figure 10:
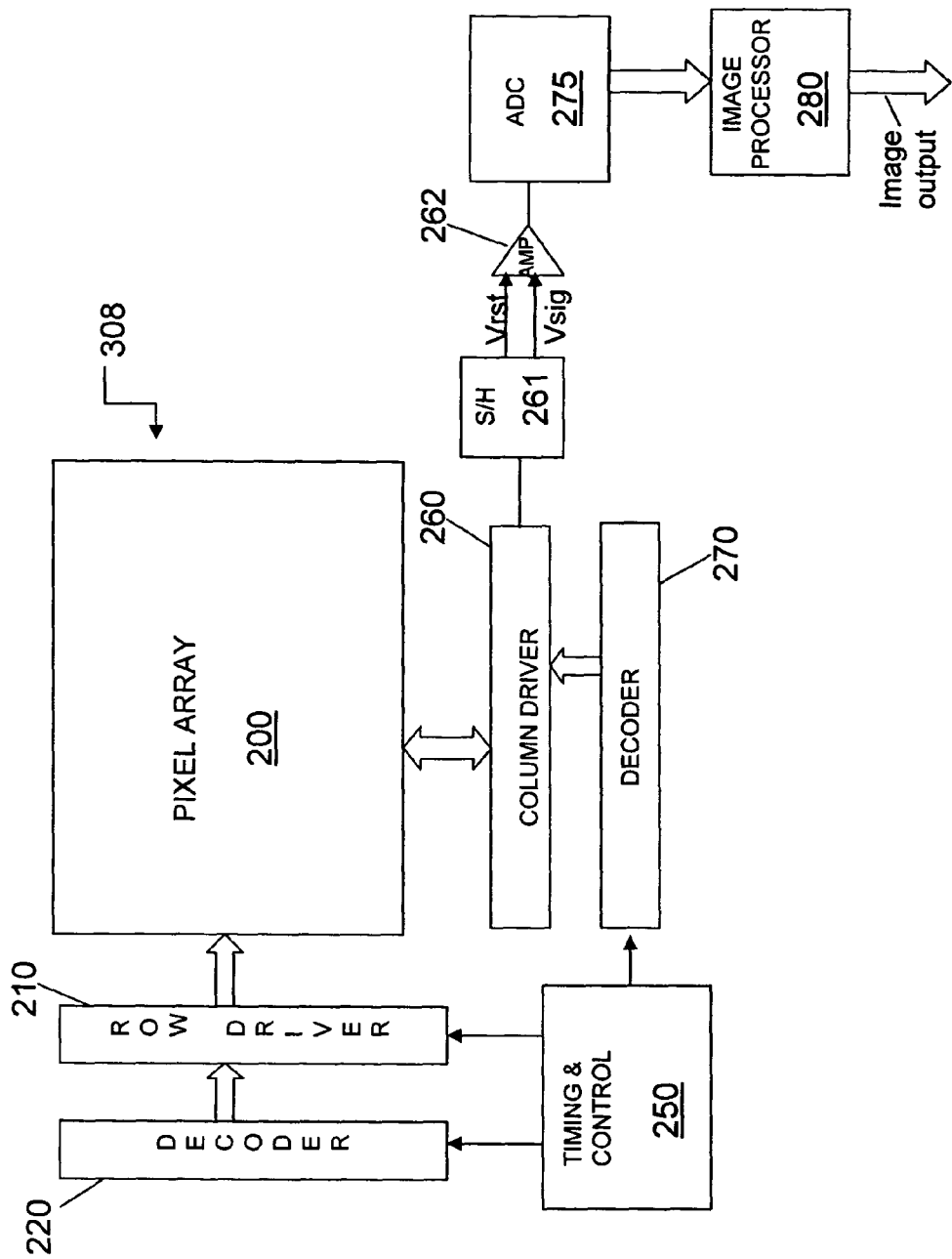
FIG. 10 is a block diagram of an integrated circuit that includes an array with an exemplary pixel cell as shown in FIG. 4.

FIG. 10 illustrates a block diagram of an exemplary CMOS imager 308 having a pixel array 200 with each pixel cell being constructed as described in one of the embodiments above. Pixel array 200 comprises a plurality of pixels arranged in a predetermined number of columns and rows (not shown). Attached to the array 200 is signal processing circuitry, as described herein, at least part of which may be formed in the substrate containing the pixel array. The pixels of each row in array 200 are all turned on at the same time by a row select line, and the pixels of each column are selectively output by respective column select lines. A plurality of row and column lines are provided for the entire array 200. The row lines are selectively activated by a row driver 210 in response to row address decoder 220. The column select lines are selectively activated by a column driver 260 in response to column address decoder 270. Thus, a row and column address is provided for each pixel.

The CMOS imager is operated by the timing and control circuit 250, which controls address decoders 220, 270 for selecting the appropriate row and column lines for pixel readout. The control circuit 250 also controls the row and column driver circuitry 210, 260 such that these apply driving voltages to the drive transistors of the selected row and column lines. The pixel column signals, which typically include a pixel reset signal ($V_{rst}$) and a pixel image signal ($V_{sig}$), are read by a sample and hold circuit 261 associated with the column device 260. $V_{rst}$ is read from a pixel immediately after the floating diffusion region 103 is reset out by the reset gate 117; $V_{sig}$ represents the charges transferred by the transfer gate 107, from the photodiode region 113 to the floating diffusion region 103. A differential signal ($V_{rst}-V_{sig}$) is produced by differential amplifier 262 for each pixel cell 100 which is digitized by analog to digital converter 275 (ADC). The analog to digital converter 275 supplies the digitized pixel signals to an image processor 280 which forms a digital image.

Figure 11:
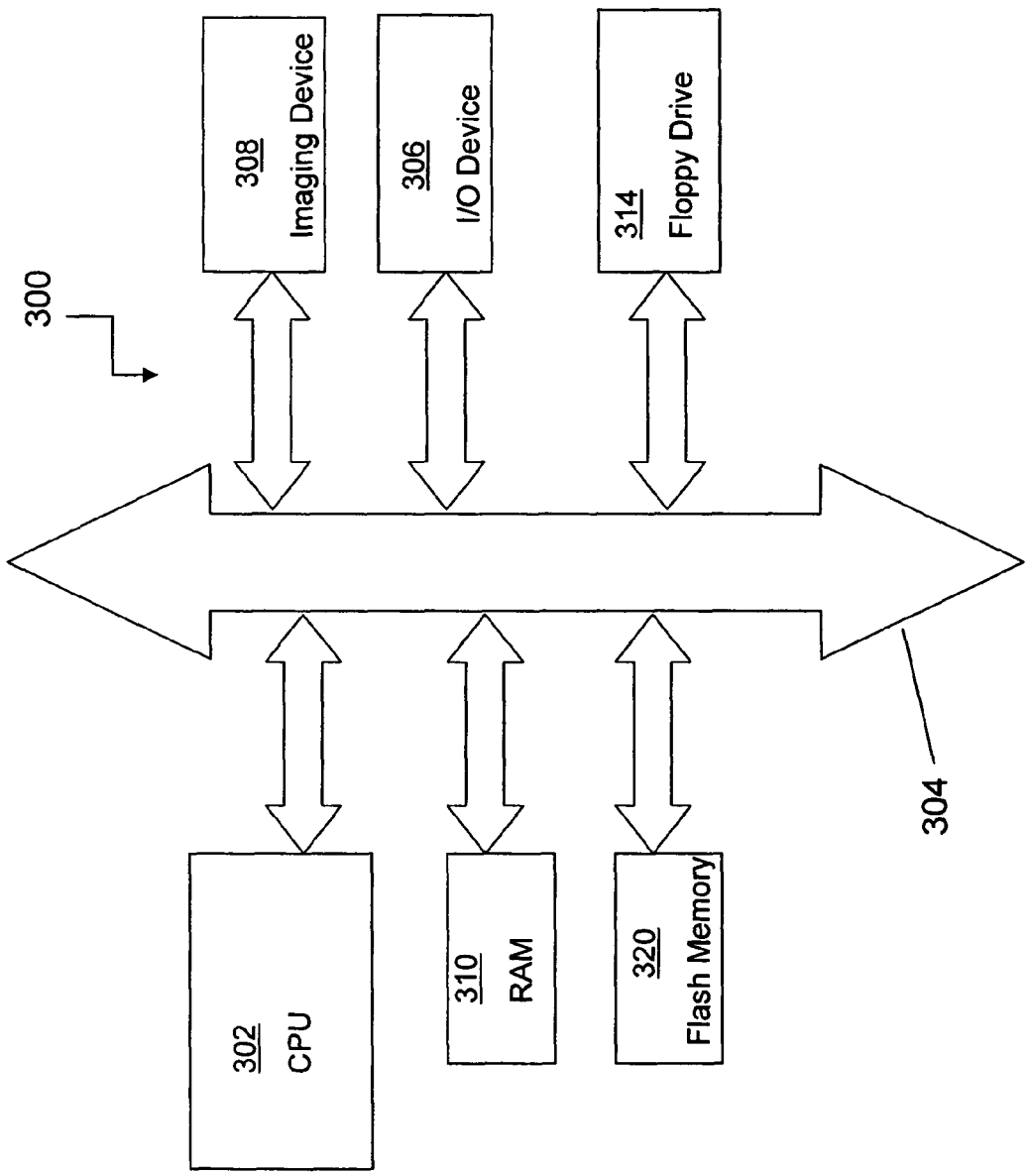
FIG. 11 illustrates a computer processor system incorporating a CMOS imager device containing one or more exemplary pixel cells according to the present invention.

FIG. 11 shows a processor system 300, which includes an imager 308 constructed in accordance with an embodiment of the invention. That is, imager 308 includes pixel cell 100 as described above. The processor system may be part of a digital camera or other imaging system. The imager 308 may receive control or other data from system 300. System 300 includes a processor 302 having a central processing unit (CPU) for image processing, or other image handling operations. The processor 302 communicates with various devices over a bus 304. Some of the devices connected to the bus 304 provide communication into and out of the system 300; an input/output (I/O) device 306 and imager 308 are such communication devices. Other devices connected to the bus 304 provide memory, for instance, a random access memory (RAM) 310 or a flash memory card 320.

The processor system 300 could alternatively be part of a larger processing system, such as a computer. Through the bus 304, the processor system 300 illustratively communicates with other computer components, including but not limited to, a hard drive and one or more peripheral memory devices such as a floppy disk drive 314.

It should again be noted that although the invention has been described with specific reference to CMOS imaging circuits having a pinned photodiode and a floating diffusion region, the invention has broader applicability and may be used in any CMOS imaging apparatus. Similarly, the process described above is but one method of many that could be used. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. An imaging device, comprising:
   a substrate doped to a second conductivity type; and
   a photosensor including:
   a pinned photodiode comprising a buried first charge accumulation region configured to accumulate a first type of charge beneath a top surface of said substrate, said first charge accumulation region doped to a first conductivity type different than said second conductivity type, and a second charge accumulation region of said second conductivity type above the first charge accumulation region, wherein said second charge accumulation region accumulates a second type of charge different than said first type of charge in response to incident light contacting said photosensor; and
   a transparent conductive layer formed over the surface of said substrate and over the pinned photodiode.

2. The imaging device of claim 1, wherein said first type of charge comprises electrons and said second type of charge comprises holes.

3. The imaging device of claim 1, wherein said first conductivity type is n-type.

4. The imaging device of claim 1, wherein said transparent conductive layer comprises indium.

5. The imaging device of claim 1, wherein the photosensor is part of a CMOS imaging device pixel array.

6. The imaging device of claim 1, wherein said transparent conductive layer comprises tin.

7. The imaging device of claim 1, wherein said transparent conductive layer comprises indium-tin oxide.

8. The imaging device of claim 1, wherein said transparent conductive layer is within the range of about 50 to about 3000 Angstroms thick.

9. The imaging device of claim 1, wherein said first and said second accumulation regions form a p/n junction beneath the surface of said substrate.

10. The imaging device of claim 1, wherein said first charge accumulation region is located about 10 to about 1000 Angstroms beneath the surface of the substrate.

11. The imaging device of claim 10, wherein said first charge accumulation region is located about 20 to about 400 Angstroms beneath the surface of the substrate.

12. The imaging device of claim 1, further comprising an insulating layer formed between the surface of the substrate and said transparent conductive layer.

13. The imaging device of claim 12, wherein the insulating layer comprises one of silicon dioxide and silicon oxide.

14. An imaging device comprising:
    a voltage source configured to supply a voltage potential;
    a substrate having a first conductivity type; and
    a pixel sensor cell including:
    a buried doped region located beneath the surface of said substrate and doped to a second conductivity type, said doped region configured to accumulate a first type of charge in response to applied light,
    an accumulation region in said substrate above said doped region, said accumulation region configured to accumulate a second type of charge different from said first type of charge, and
    a transparent conductive layer selectively connected to said voltage source and configured to apply said voltage potential to a substrate region located over said doped region.

15. The imaging device of claim 14, wherein said first type of charge comprises electrons and said second type of charge comprises holes, and wherein said voltage potential is negative.

16. The imaging device of claim 14, further comprising an isolation trench in said substrate and located adjacent said doped region.

17. The imaging device of claim 16, wherein said transparent conductive layer is located at least partially over said isolation trench.

18. The imaging device of claim 14, wherein said transparent conductive layer comprises at least one of indium oxide, tin oxide, and indium-tin oxide.

19. The imaging device of claim 18, wherein said transparent conductive layer is about 50 to about 3000 Angstroms thick.

20. The imaging device of claim 18, wherein said first conductivity type is p-type.

21. The imaging device of claim 18, further comprising an insulating layer formed between the surface of said substrate and said transparent conductive layer.

22. The imaging device of claim 21, wherein said insulating layer comprises one of silicon dioxide, oxide, and nitride.

23. The imaging device of claim 22, wherein said isolation trench comprises a trench etched in the surface of said substrate and filled with a dielectric material.

24. The imaging device of claim 22, wherein said transparent conductive layer is located at least partially over an adjacent transistor.

25. The imaging device of claim 18, further comprising a transistor having a gatestack for transferring charges from said first doped region to a second doped region in said substrate.

26. The imaging device of claim 25, wherein said transparent conductive layer is spaced apart from a side of said transistor.

27. The imaging device of claim 25, wherein said transparent conductive layer is located adjacent to said transistor for transferring charge.

28. The imaging device of claim 27, wherein said transparent conductive layer is separated from said gate stack of said transistor by an insulating sidewall.

29. The imaging device of claim 25, wherein said transfer transistor comprises a conductive layer comprising one of indium oxide, tin oxide, and indium-tin oxide.

30. The imaging device of claim 29, further comprising a row select transistor and a source follower transistor, each comprising a conductive layer comprising one of indium oxide, tin oxide, and indium-tin oxide.

* * * * *